United States Patent [19]
Schremmer

[11] Patent Number: 6,104,617
[45] Date of Patent: Aug. 15, 2000

[54] EXTENDED PC CARD WITH EXTENSION CONNECTION

[75] Inventor: Andreas Schremmer, Schorndorf, Germany

[73] Assignee: ITT Manufacturing Enterprises, Inc., Wilmington, Del.

[21] Appl. No.: 09/041,484

[22] Filed: Mar. 12, 1998

[30] Foreign Application Priority Data

Mar. 13, 1997 [DE] Germany ............ 197 10 515

[51] Int. Cl.⁷ .................................................. H05K 7/14
[52] U.S. Cl. .................... 361/737; 361/728; 361/736; 361/740; 361/752
[58] Field of Search ............................. 361/728, 736, 361/737, 740, 741, 747, 752, 796, 802; 211/41.17; 206/706

[56] References Cited

U.S. PATENT DOCUMENTS

| | | |
|---|---|---|
| 3,950,059 | 4/1976 | Anhalt et al. . |
| 4,026,623 | 5/1977 | Goodman et al. . |
| 4,083,619 | 4/1978 | McCormick et al. . |
| 5,310,352 | 5/1994 | Mroczkowski et al. . |
| 5,376,016 | 12/1994 | Inaba et al. . |
| 5,513,074 | 4/1996 | Ainsbury . |
| 5,701,230 | 12/1997 | Liang et al. . |

FOREIGN PATENT DOCUMENTS

| | | |
|---|---|---|
| 96107165 | 10/1999 | European Pat. Off. . |
| 44 06 644 A1 | 7/1995 | Germany . |

*Primary Examiner*—Gerald Tolin
*Assistant Examiner*—Jayprakash N. Gandhi
*Attorney, Agent, or Firm*—Thomas L. Peterson

[57] ABSTRACT

A PC card has a sheet metal forward housing part (13) whose rear edge (36) is connected to a plastic molded rear extension part (14) before a sheet metal lower housing element (11) is connected to them, which enables simple coupling of the forward and rearward parts so the two of them can be handled prior to full assembly of the card. The rear edge of the sheet metal forward housing part includes a pair of side tabs (38, 39) at laterally opposite sides and a center tab (44) at the center. The plastic molded part has a front edge portion (110) with a pair of vertical slots (28, 29) at opposite sides for receiving the side tabs, and with a groove (36) at the middle for receiving the center tab. With the plastic molded part lying horizontal, the sheet metal forward part is held in a vertical plane with the side tabs projecting down into the side slots and the center tab lying in the center recess. The sheet metal forward part is then pivoted down, causing the side tabs to bend about 90°, and causing the center tab to slide under the front edge portion of the plastic part, thereby temporarily locking the housing parts together.

8 Claims, 6 Drawing Sheets

EXTENDED PC CARD WITH EXTENSION CONNECTION

BACKGROUND OF THE INVENTION

PC cards constructed in accordance with PCMCIA (Personal Computer Memory Card International Association) standards have a main portion with a length of about 86 mm, a width of about 54 mm, and a thickness that, for Type II cards is 5 mm. Extensions are permitted under the standard. The standard portion (about 86 mm long) is commonly provided with a sheet metal cover for preventing the passage of EMI (electromagnetic interference). Some types of extensions have plastic molded housings, as where the extension includes an antenna for transmitting or receiving electromagnetic energy.

The housing can include an upper front housing portion formed by a sheet metal part extending along about 86 mm of the card length, and a plastic molded extension extending rearward thereof. In assembling the PC card, the sheet metal upper front cover part and plastic molded rear extension part are commonly coupled together before the assembly is finished by attaching the sheet metal lower housing part that holds a circuit board and front connector. Simple joints between the sheet metal upper housing part and the plastic molded extension part could be used but they are relatively loose and can come apart during handling. A simple joint that connected the sheet metal upper front housing part and the plastic molded extension part in a joint that prevented their separation prior to full assembly, would be of value.

SUMMARY OF THE INVENTION

In accordance with one embodiment of the present invention, an extended PC card is provided, of the type that includes a sheet metal cover lying about the standard portion of the card and a plastic molded housing at a rearward extension of the card, which facilitates assembly of the card. The sheet metal upper housing part has a rear edge with a pair of side tabs at its opposite sides and a center tab at its center. The plastic extension housing has a front edge portion with a pair of vertical slits at its opposite sides and with a recess at its center. The housing parts are joined by placing the plastic housing part horizontal and the sheet metal upper part vertical so its side tabs project into the slits and the center tab lies in the recess. The sheet metal upper housing part is then bent to the horizontal, causing its side tabs to bend about 90° while its center tab slips under the plastic housing part at a location immediately rearward of the recess.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
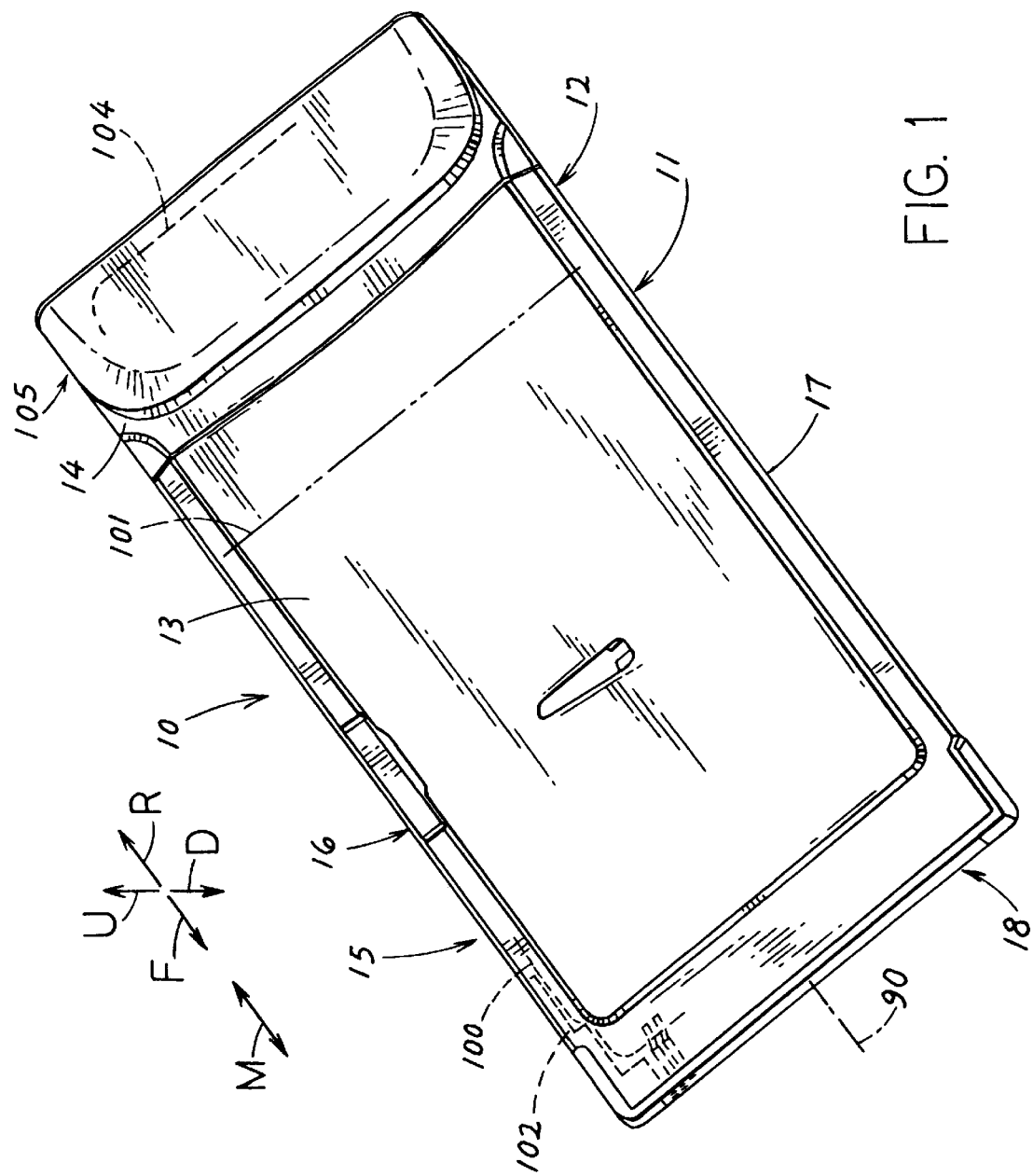
FIG. 1 is a top and front isometric view of an extended PC card constructed in accordance with the present invention, with the card shown fully assembled.

FIG. 1 illustrates an extended standard PC card with a front portion 13 extending to line 101, generally being constructed in accordance with PCMCIA standards. The standards specify that the card has a thickness in vertical directions U, D of no more than 5 mm for a Type II card, and has a length in longitudinal directions F, R of no more than about 86 mm. An upper housing portion 12 includes a sheet metal upper front housing part 13 and a rear end part 14 that extends rearwardly R from the upper front part. In the particular card shown, the rear end housing part, or extension part 14 holds an antenna 104 for transmitting and receiving electromagnetic signals. As a result, the part 14 is constructed of dielectric plastic material that can pass such radiation, to form an extension 105 that includes the housing part 14 and antenna 104, plus rear portions of the circuit board and lower element 11. The upper front housing part 13 and a lower housing element 11 are both constructed of sheet metal that blocks the passage of electromagnetic radiation.

The card includes a circuit board 100 that extends along almost the entire length of the card, and a front connector 18 at the front end of the circuit board. The PC card 10, which has a normally horizontal axis 90, is commonly assembled by using a front mechanical connector 102 to connect the front end of the circuit board 100 to the front connector 18, and by soldering contact tails of contacts of the front connector 18 to traces on the circuit board. The sheet metal upper front housing part 13 and the plastic molded housing extension part 14 are assembled and then placed around the combination of circuit board, mechanical connector, and front connector. Finally, the lower housing portion 11 is installed, as by snapping side rails 16, 17 of the upper housing part around corresponding side rails of the lower housing part, and possibly welding the rails of the upper and lower sheet metal housing parts.

A problem occurs during the connection of the upper housing part 13 to the plastic molded rear extension part 14 prior to their connection to the circuit board and other parts and mounting of the lower housing portion 11. Applicant constructs the parts 13, 14 so they can be assembled and will hold together as a unit in a simple manner that can be easily performed by a PC card maker. Such PC card maker manufactures the circuit board 100 to particular specifications, purchases the other parts of the PC card from component manufacturers, and assembles the parts together.

Figure 2A:
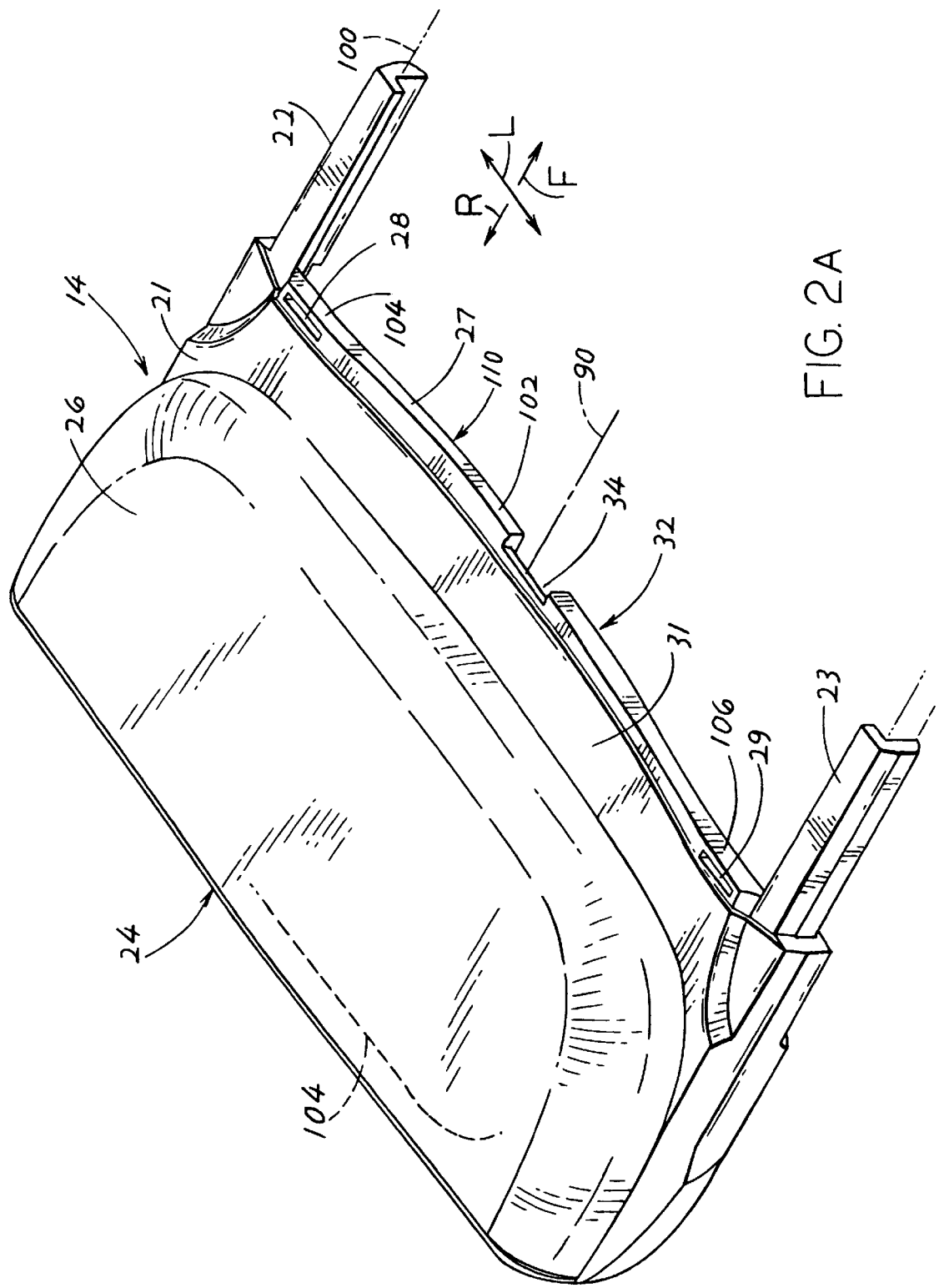
FIG. 2A is a front and top isometric view of the plastic molded rear extension of the card of FIG. 1.

FIG. 2A shows details of the plastic molded housing rear extension part 14. The part 14 includes a largely rectangular region 21 as viewed in a plan view, and a pair of rails 22, 23 extending forwardly F from laterally L opposite sides of the rectangular region. The antenna indicated at 104 lies within a raised part 26 of the rectangular region 21, with a rear and top end face 24 being shown. The plastic molded part has a front edge portion 110 with laterally opposite sides 104, 106, and with vertical through slots 28, 29 at the sides. The through slots or slits 28, 29 are thin and elongated in a lateral direction L. The front edge portion 110 also has a groove 34 extending rearwardly into the front edge portion at the center thereof. The rectangular region 21 has upper and lower surfaces 31, 32 with a step down at the forward edge portion 110, and with the groove 34 extending along the entire height of the front edge portion.

Figure 2B:
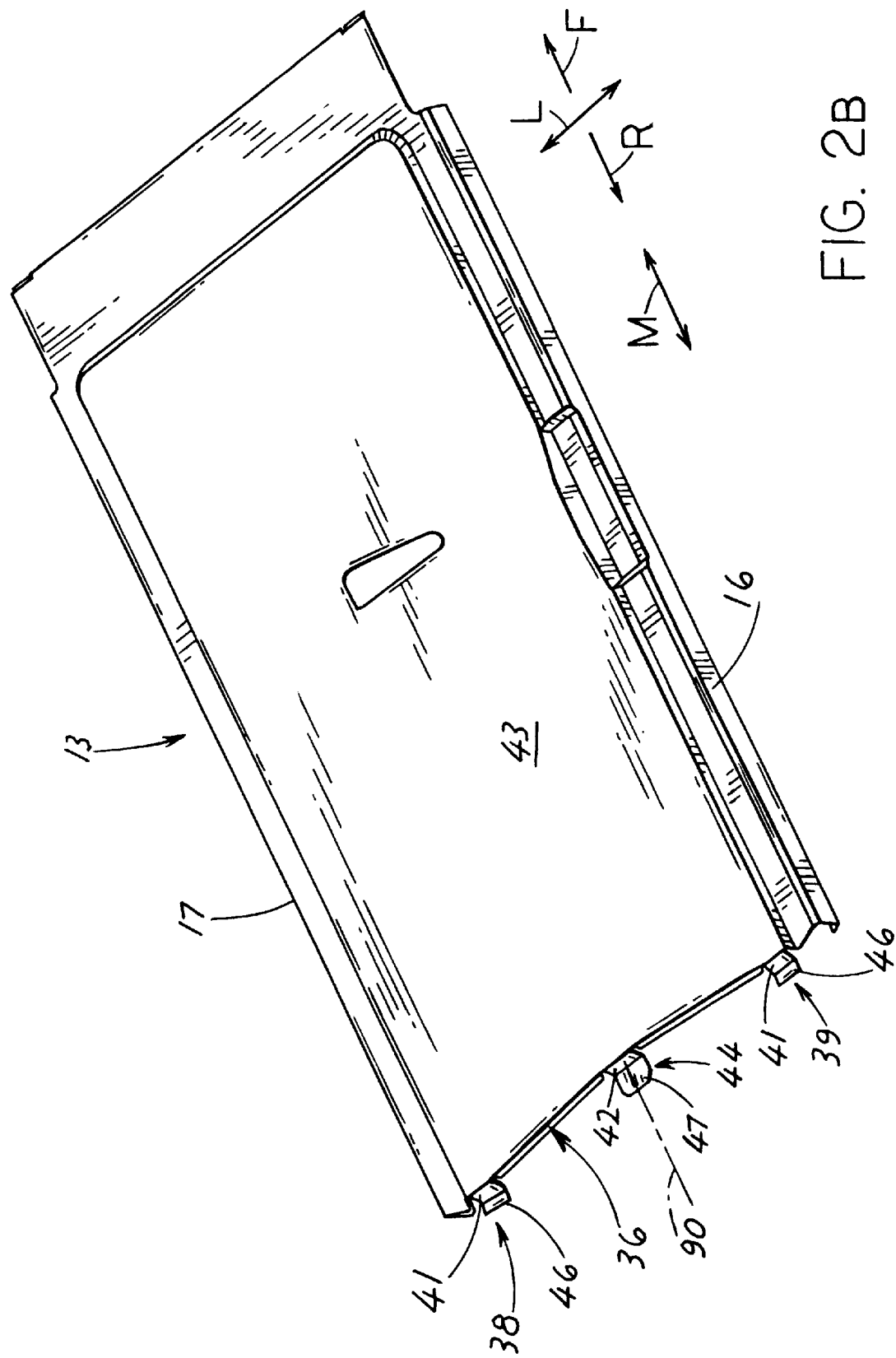
FIG. 2B is a rear top isometric view of the sheet metal upper front housing part of the card of FIG. 1.

FIG. 2B shows the sheet metal upper housing part 13, showing that ts rear end or edge 36 has laterally opposite sides with side tabs 38, 39 thereat, and with a center tab 44 about halfway between the side tabs. The side tabs each have a downward tab portion 41 and a rearwardly-extending free end 46. The center tab also has a downward tab portion 42 and a rearwardly-extending free end 47. The downward tab portions all extend generally downwardly from the rear end 36 of a planar portion 43 of the upper housing part 13. The free end 47 of the center tab is preferably longer than those of the side tabs.

Figure 3:
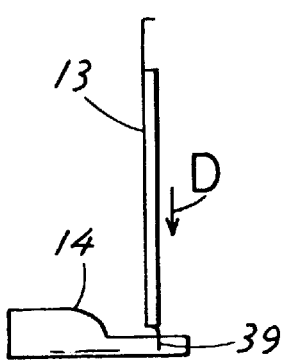
FIGS. 3–7 show steps in the assembly of the parts of FIGS. 2A and 2B.
Figure 4:
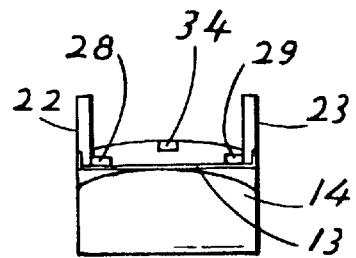
Figure 5:
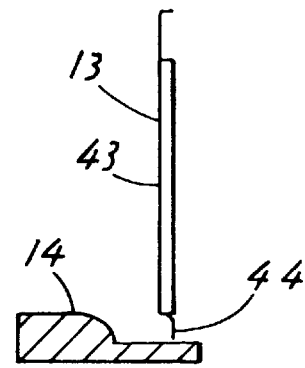
Figure 6:
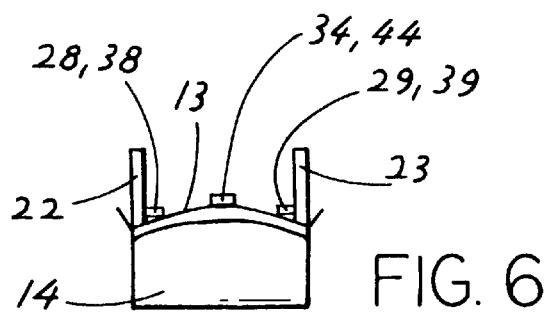
Figure 7:
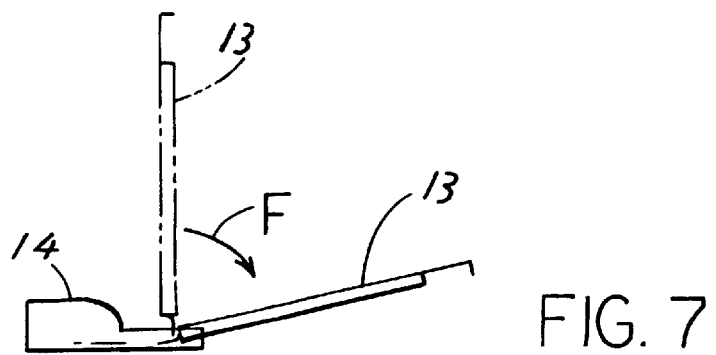
Figure 8:
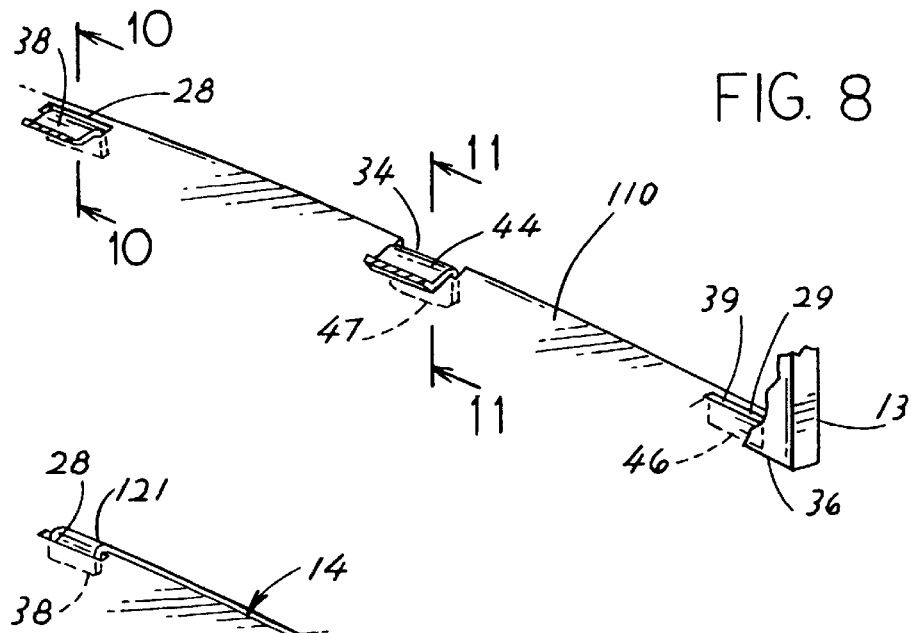
FIG. 8 is a partial rear isometric view of the housing parts of FIGS. 2A and 2B, shown during a first step in the assembly.
Figure 9:
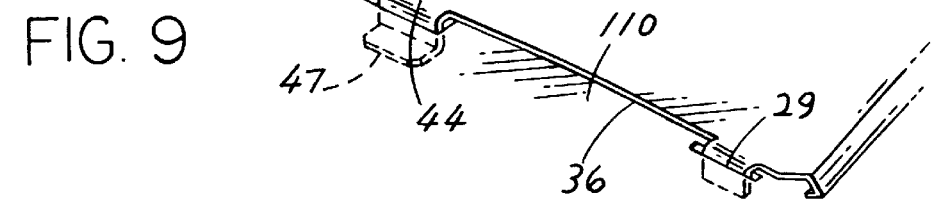
FIG. 9 is a view similar to that of FIG. 8, but shown during a second step in the assembly.
Figure 10:
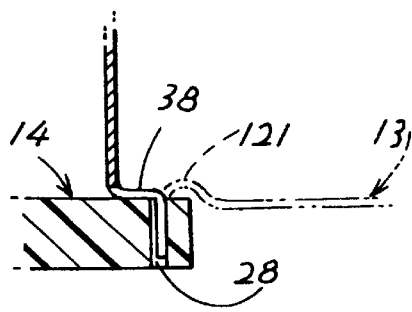
FIG. 10 is a view taken on line 10—10 of FIG. 8, and containing phantom lines showing a side tab after the front housing part has been pivoted to the horizontal.
Figure 11:
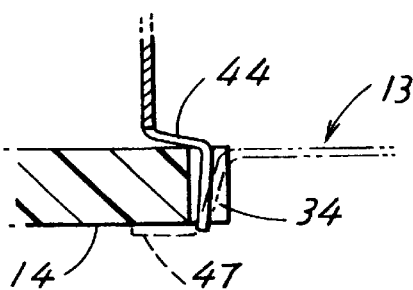
FIG. 11 is a view taken on line 11—11 of FIG. 9, and containing phantom lines showing a center tab after the front housing part has been pivoted to the horizontal.

The sheet metal upper housing part 13 of FIG. 2B is assembled to the plastic molded rear extension housing part 14 of FIG. 2A by orienting them as shown in FIG. 5, with the sheet metal upper housing part 13 extending vertically (its planar portion 43 extends vertically) while the plastic extension part 14 extends horizontally. The sheet metal upper housing part is moved down slightly, along arrow D in FIG. 3, to the position shown in FIG. 8, where the free ends 46 of the side tabs 38, 39 project into the slits 28, 29 in the plastic part 14. The side tabs each has a lateral width about equal to the width of one of the slits. At this time, the free end 47 of the center tab 44 lies in the groove 34 of the plastic molded part. Then, the planar portion 43 of the sheet metal upper housing part is pivoted 90° to the horizontal, as shown by arrow F in FIG. 7. As shown in FIG. 9, such bending results in the side tabs 38, 39 being bent at 121, and results in the free end 47 of the center tab 44 sliding under the plastic molded extension part 14, or at least under the front edge part 110 thereof. As shown In FIG. 7, after the sheet metal part 13 has been bent 90° to the horizontal, it springs up slightly to the position shown in FIG. 7. However, as shown in FIG. 11, the sheet metal part 13 and plastic molded part 14 are temporarily locked together, by the fact that the side tabs such as 38 extend downwardly into slits such as 28 of the plastic part and up and forward thereof, while the center tab 44 extends down and its free end 47 slides under the plastic part 14 as shown in phantom lines.

Applicant prefers to form the front edge 27 (FIG. 2A) of the plastic molded part 14 so it is slightly convex, and to form the rear edge 36 (FIG. 2B) of the sheet metal upper housing part 13 so it is slightly concave. As a result, when the center tab 44 lies in the groove 44, and the side tabs bend about axes lying close to a position immediately over the slits 28, 29, the center tab moves downwardly and forwardly to move under the front edge portion 110 immediately rearward of the groove 34.

Figure 12:
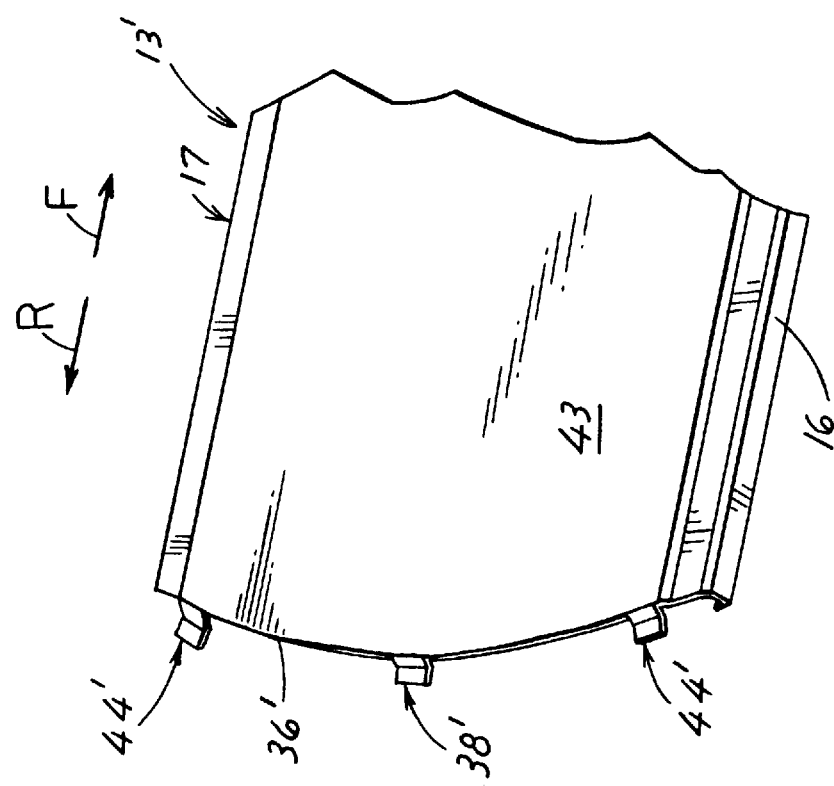
FIG. 12 is an exploded isometric view of another embodiment of the invention.
Figure 12:
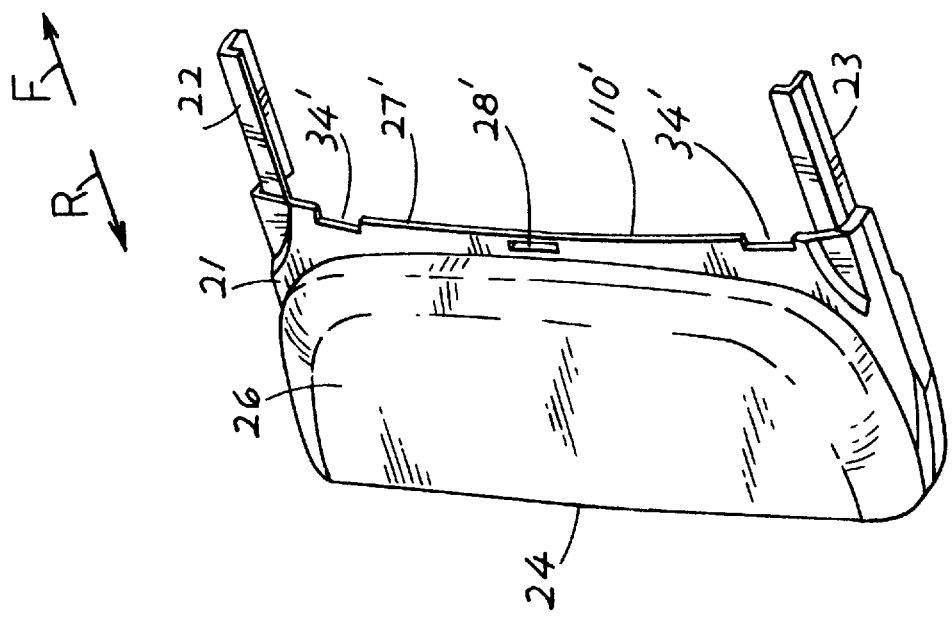

FIG. 12 illustrates another embodiment of the invention, where the extension 14 has a front edge portion 110' with a slit 28' at the center and with grooves 34' at the laterally opposite sides. The sheet metal upper housing part 13' has a center tab 38' that is intended to pass down Into the slit 28', and has opposite side tabs 44' that are longer and that are intended to move down into the grooves 34', so when the part 13' is bent to the horizontal the side tabs 44' will move under the front edge portion 110' at locations immediately rearward of the grooves 34'. In this embodiment of the invention, the forward edge 27' of the extension part is concave while the rearward edge 36' of the sheet metal upper housing part is convex.

While terms such as "upper," "lower," etc. have been used to describe the invention as illustrated, it should be understood that the card can be used in any orientation with respect to the Earth.

Thus, the invention provides an extended PC card wherein one of the sheet metal cover parts such as the front upper one, must be attached to a molded housing extension part, which facilitates coupling of the parts. The molded part has a forward edge portion with at least one vertical slit for receiving a slit-mounting tab extending from the rear of the sheet metal part, and has at least one recess for receiving a recess-receiving tab extending from the rear of the sheet metal part. The slit-receiving tab is inserted downwardly into the slit while the recess-received tab lies in the recess, and the sheet metal upper housing part is bent to the horizontal to move the recess-receiving tab under the forward edge portion of the plastic part. Where slit receiving tabs lie on opposite sides, the front edge portion of the plastic part is convexly rounded with the rear edge of the sheet metal upper housing part being concavely rounded. The reverse is used where the recess-receiving tabs lie at opposite sides of the rear of the sheet metal housing part Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A PC card housing assembly that extends in mutually perpendicular front and rear longitudinal directions, lateral directions, and vertical directions, comprising:

a sheet metal front housing part which has a longitudinally extending length and which has a primarily laterally-extending rear edge with a plurality of largely rearwardly-extending tabs at said rear edge, including at least one slit-entering tab and at least one groove-entering tab;

a molded rear housing part that extends rearwardly from said rear edge of said front housing part, with said rear housing part having a primarily laterally-extending front edge portion with a pair of opposite sides and a middle lying between said opposite sides, and with at least one primarily vertical slit in said front edge portion and with at least one groove that extends rearwardly into said front edge portion;

said front and rear housing parts are constructed so when said rear housing part extends horizontally and said front housing part is oriented to extend upwardly from said front edge portion while said slit-entering tab projects primarily vertically into said slit while said groove-extending tab lies in said groove, and said rear housing part is pivoted about 90° to its normal position, said slit entering tab will bend while said rear end of said groove entering tab slides under said front edge portion at a location immediately rearward of said groove.

2. The PC card housing assembly described in claim 1 wherein:

said rear edge of said front housing part has laterally opposite sides and has a middle lying between said sides, and said plurality of tabs includes a pair of slit-entering tabs that each lies at one of said sides and a groove-entering tab that lies at said middle.

3. The PC card assembly described in claim 2 wherein:
said front edge portion of rear housing part is convex in a forward-facing direction as seen in a plan view;

said rear edge of said front housing part is concave in a rearwardly-facing direction as seen in a plan view when said normally horizontal length is horizontal.

4. The PC card assembly described in claim 1 wherein:

said rear edge of said front housing part has laterally opposite sides and has a middle lying between said sides, and said plurality of tabs includes a pair of groove-entering tabs that each lies at one of said sides and a slit-entering tab that lies at said middle.

5. The PC card assembly described in claim 4 wherein:

said front edge portion of rear housing part is concave in a rearwardly-facing direction as seen in a plan view;

said rear edge of said front housing part is convex in a rearwardly-facing direction as seen in a plan view when said normally horizontal length is horizontal.

6. A PC card which includes a PCMCIA standard front portion and a rearward extension, where said PC card includes a circuit board with front and rear end portions with said rear end portion extending into said extension, a front connector at said circuit board front portion, and a housing wherein:

said housing includes upper and lower housing parts, where said upper housing part is formed of sheet metal and has a rear edge;

said extension includes a molded rear housing extension part, with a front edge portion;

said front edge portion has slit and groove means for receiving tabs, and said rear edge of said sheet metal upper housing parts has slit-entering tab means and groove entering tab means for respectively entering said slit means and said groove means to lock said rear edge to said front edge portion.

7. A method for readily joining the rear edge of a sheet metal front housing part that has a normally horizontal longitudinal axis to the front edge portion of a molded rear housing part that has a normally horizontal longitudinal axis, comprising:

forming said front housing part with at least one slit-entering tab and at least one groove-entering tab, with each tab having a primarily rearwardly-extending free end, and forming said front edge portion with at least one vertical slit and with at least one groove that extends rearwardly into said front edge portion;

orienting said rear housing part so its longitudinal axis is horizontal;

orienting and positioning said front housing part so its longitudinal axis is largely vertical while said slit-entering tab lies in said slit and said groove-entering tab lies in said groove, and then pivoting said front housing part to about the horizontal while bending said slit-entering tab and while said rear end of said groove-entering tab slides under said front edge portion at a location rearward of said groove.

8. The method described in claim 7 wherein:

said forming of said front housing part includes forming it with laterally opposite sides and with a pair of said slit-entering tabs at said sides, and with said groove-entering tab lying between said sides;

said step of forming includes forming said front edge portion with laterally opposite sides and with a pair of said vertical slits at said sides, and with a forwardly-opening groove between said sides of said front edge portion, with said slits each having a lateral width equal to the width of a corresponding one of said slit entering tabs, and with said slits and said groove aligned with said slit-entering tabs and said groove-extending tab.

* * * * *